United States Patent
Komeno et al.

(10) Patent No.: US 10,208,378 B2
(45) Date of Patent: Feb. 19, 2019

(54) CHEMICAL VAPOR DEPOSITION APPARATUS

(71) Applicant: Hermes-Epitek Corp., Taipei (TW)

(72) Inventors: Junji Komeno, Kanagawa (JP); Noboru Suda, Tokyo-to (JP); Takahiro Oishi, Kanagawa (JP); Tsan-Hua Huang, Tainan (TW); Shih-Yung Shieh, Hsinchu (TW)

(73) Assignee: Hermes-Epitek Corp., Taipei (TW)

( * ) Notice: Subject to any disclaimer, the term of this patent is extended or adjusted under 35 U.S.C. 154(b) by 0 days.

(21) Appl. No.: 15/374,163

(22) Filed: Dec. 9, 2016

(65) Prior Publication Data

US 2018/0163301 A1    Jun. 14, 2018

(51) Int. Cl.
*C23C 16/44* (2006.01)
*C23C 16/455* (2006.01)
*C23C 16/458* (2006.01)

(52) U.S. Cl.
CPC ...... *C23C 16/4412* (2013.01); *C23C 16/4586* (2013.01); *C23C 16/45557* (2013.01)

(58) Field of Classification Search
None
See application file for complete search history.

(56) References Cited

U.S. PATENT DOCUMENTS

| | | | | |
|---|---|---|---|---|
| 5,534,069 A | * | 7/1996 | Kuwabara | B01D 53/72 118/715 |
| 5,758,680 A | * | 6/1998 | Kaveh | G05D 16/2013 118/692 |
| 6,312,526 B1 | * | 11/2001 | Yamamuka | C23C 16/4401 118/506 |

* cited by examiner

*Primary Examiner* — Jethro M. Pence
(74) *Attorney, Agent, or Firm* — Muncy, Geissler, Olds & Lowe, P.C.

(57) ABSTRACT

A chemical vapor deposition apparatus comprises a ballast gas source and a mass flow controller, wherein the ballast gas source is arranged at an upstream side of a separating device, and the pressure in a reaction chamber is controlled by a flow rate of the ballast gas. Since the space between the reaction chamber and the node connected with the ballast gas source is small, a pressure response of the reaction chamber can be speeded up.

12 Claims, 6 Drawing Sheets

CHEMICAL VAPOR DEPOSITION APPARATUS

BACKGROUND OF THE INVENTION

1. Field of the Invention

The present invention relates to a deposition apparatus, and more particularly to a chemical vapor deposition apparatus.

2. Description of the Prior Art

Chemical vapor deposition (CVD) is a chemical process used to produce solid materials with high quality and high-performance. For example, the CVD process is often used in the semiconductor industry to produce thin films. In typical CVD process, a substrate (such as wafer) is arranged in a reaction chamber and exposed to one or more precursors, which react on the substrate surface to produce the desired thin films. CVD can be broadly classified into a low pressure chemical vapor deposition (LPCVD), an atmospheric pressure chemical vapor deposition (APCVD), a low temperature chemical vapor deposition (LTCVD), a plasma enhanced chemical vapor deposition (PECVD), and a metal organic chemical vapor deposition (MOCVD).

The pressure in reaction chamber is important for CVD process. If the pressure is changed, velocity of flow and concentration of precursor are also changed, which are so important for CVD process. Therefore, the pressure in reaction chamber should be controlled constant. The noises of gas source pressure or irregular change of pumping power caused by the noise of electric power are factors which make an impact on the pressure in reaction chamber. In order to compensate such an irregular change of the pressure in reaction chamber, CVD apparatuses generally have a mechanism to maintain the reactor pressure constant.

In conventional chemical vapor deposition apparatus, the pressure in the reaction chamber is controlled by a throttle valve which is arranged on an exhaust path. Pressure control is executed by changing the conductance of throttle valve. When open level of the throttle valve is decreased, the gas flow is stagnated, which results in increase of the pressure in reaction chamber. On the contrary, when open level of throttle valve is increased, the gas flow is accelerated, which results in decrease of the pressure in reaction chamber. To avoid the throttle valve be contaminated by exhaust gases from the reaction chamber, a filter is arranged at upstream side of the throttle valve to filter the exhaust gases. Unreacted reaction gas and/or by-product of reaction are trapped by the filter which has a large space from the structural adequacy. Since this large space exists between a control means of throttle valve and a control object of reactor chamber, the pressure in the reaction chamber cannot respond rapidly with the adjustment of the throttle valve.

Accordingly, it is highly desirable to speed up the pressure response of the reaction chamber.

SUMMARY OF THE INVENTION

The present invention is directed to a chemical vapor deposition apparatus which provides a ballast gas source arranged at upstream side of a separating device and controls a flow rate of the ballast gas to change the local pressure with exhaust gas at a node connected with the ballast gas, so that the pressure in a reaction chamber can respond rapidly.

In one embodiment, the proposed chemical vapor deposition apparatus is configured for forming a film on a substrate and includes a reaction chamber, a first pressure detector, a pressure controller, a separating device, a ballast gas source, and a mass flow controller. The reaction chamber includes an inlet port and an exhaust vent, wherein a processing gas flows into the reaction chamber through the inlet port, an exhaust gas is exhausted from the reaction chamber through the exhaust vent, and the processing gas comprises a reaction gas. The first pressure detector is electrically connected with the reaction chamber to detect a pressure in the reaction chamber and output a feedback signal. The pressure controller is electrically connected with the first pressure detector to generate a control signal according to the feedback signal. The separating device is connected with the exhaust vent of the reaction chamber to remove at least one of the reaction gas and a byproduct from the exhaust gas. The ballast gas source is connected between the exhaust vent of the reaction chamber and the separating device. The mass flow controller is electrically connected with the pressure detector to control a flow rate of a ballast gas from the ballast gas source according to the feedback signal.

The objective, technologies, features and advantages of the present invention will become apparent from the following description in conjunction with the accompanying drawings wherein certain embodiments of the present invention are set forth by way of illustration and example.

BRIEF DESCRIPTION OF THE DRAWINGS

The foregoing conceptions and their accompanying advantages of this invention will become more readily appreciated after being better understood by referring to the following detailed description, in conjunction with the accompanying drawings, wherein.

DESCRIPTION OF THE PREFERRED EMBODIMENT

Various embodiments of the present invention will be described in detail below and illustrated in conjunction with the accompanying drawings. In addition to these detailed descriptions, the present invention can be widely implemented in other embodiments, and apparent alternations, modifications and equivalent changes of any mentioned embodiments are all included within the scope of the present invention and based on the scope of the Claims. In the descriptions of the specification, in order to make readers have a more complete understanding about the present invention, many specific details are provided; however, the present invention may be implemented without parts of or all the specific details. In addition, the well-known steps or elements are not described in detail, in order to avoid unnecessary limitations to the present invention. Same or similar elements in Figures will be indicated by same or similar reference numbers. It is noted that the Figures are schematic and may not represent the actual size or number of the elements. For clearness of the Figures, some details may not be fully depicted.

Figure 1:
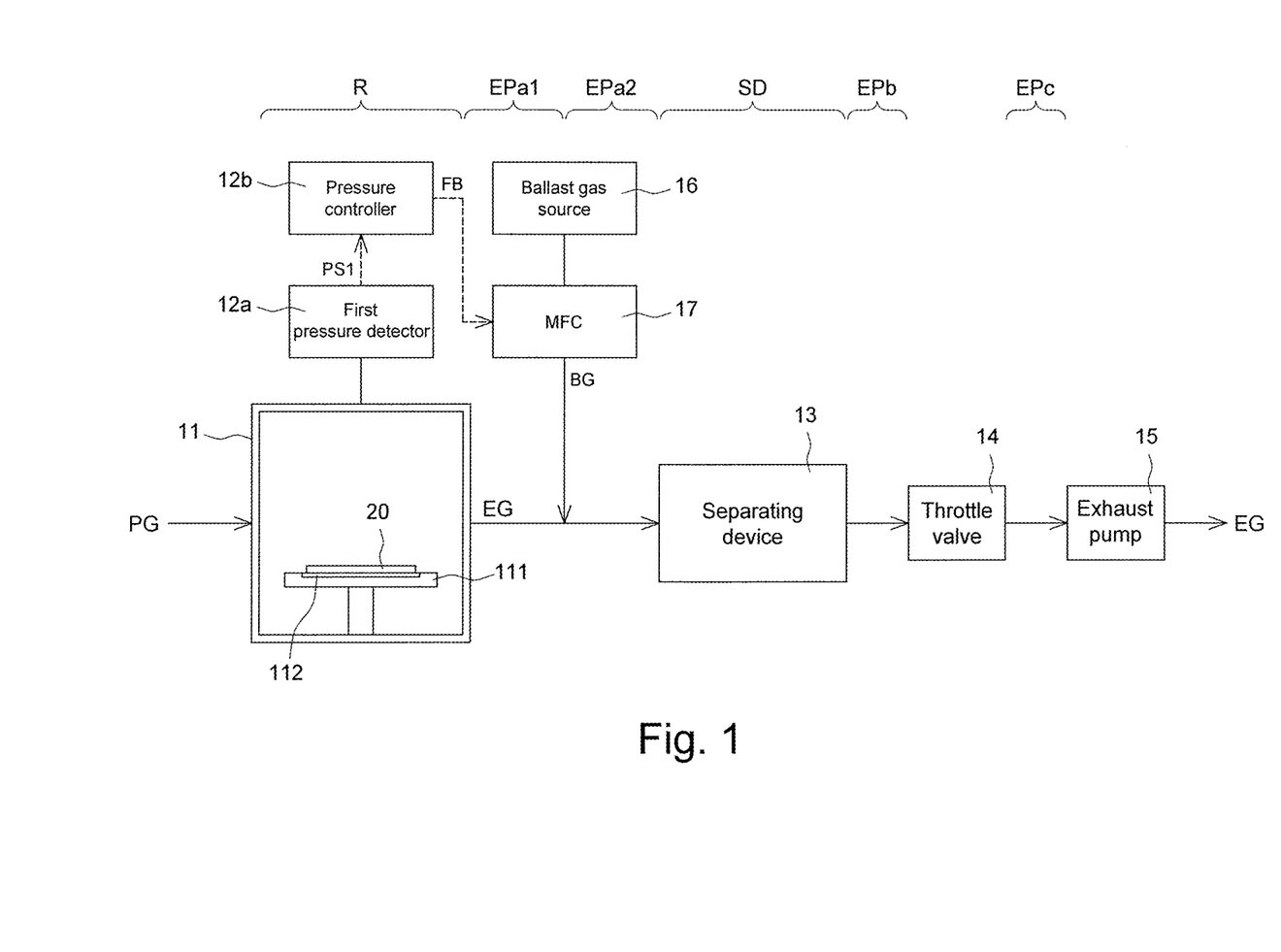
FIG. 1 is a diagram schematically illustrating a chemical vapor deposition apparatus according to a first embodiment of the present invention.

A chemical vapor deposition (CVD) apparatus of the present invention is configured for forming a thin film on a substrate. Referring to FIG. 1, a chemical vapor deposition (CVD) apparatus according to an embodiment of the present invention comprises a reaction chamber 11, a first pressure detector 12a, a pressure controller 12b, a separating device 13, a ballast gas source 16, and a mass flow controller (MFC) 17. The reaction chamber 11 includes an inlet port and an exhaust vent. A processing gas PG flows into the reaction chamber 11 through the inlet port. An exhaust gas EG after reaction is exhausted from the reaction chamber 11 through the exhaust vent. In one embodiment, the processing gas PG includes a carrier gas and at least one reaction gas (such as precursor) which reacts on a surface of the substrate 20 to produce the desired thin film. The exhaust gas EG includes the reaction gas unreacted on the substrate 20 and byproducts after reaction.

For example, the substrate 20 may be a semiconductor substrate, a glass substrate or the like; the thin film is a compound of semiconductor and oxidation film. In one embodiment, the substrate 20 may be a gallium arsenide (GaAs), gallium phosphide (GaP), indium phosphide (InP), silicon (Si), silicon carbide (SiC), or sapphire ($Al_2O_3$), etc. The grown thin film may be III-V compound semiconductor, such as gallium arsenide (GaAs), aluminum gallium arsenide (AlGaAs), indium gallium aluminum phosphide (AlGaInP), indium gallium nitride (InGaN), or II-VI compound semiconductor. The foregoing semiconductor film can be applied to the production of the photovoltaic element (such as light emitting diodes, laser diodes or solar cell) or high electron mobility transistor (HEMT). In one embodiment, the reaction gas may include a metal compound or an organometallic compound. For example, the reaction gas may include arsine ($AsH_3$), phosphine ($PH_3$), ammonia ($NH_3$) and disilane ($Si_2H_6$), trimethylgallium (TMGa), trimethylaluminum (TMAl), trimethylindium (TMIn), bis(cyclopentadienyl)magnesium (Cp2Mg), diisopropyltelluride (DIPTe), etc. It can be understood that the metal compound or the organometallic compound can flow into the reaction chamber 11 with a carrier gas. In one embodiment, the carrier gas may be hydrogen ($H_2$) or nitrogen ($N_2$).

In one embodiment, the CVD apparatus of the present invention further comprises a holding element 111 which is arranged in the reaction chamber 11 to hold the substrate 20. In one embodiment, the CVD apparatus of the present invention further comprises a heating element 112 which is arranged in the reaction chamber 11 to heat the substrate 20. For example, the heating element 112 is arranged on the holding element 111 to heat the substrate 20 so as to promote the reaction gas react on the surface of the substrate 20 to form the thin films.

The first pressure detector 12a is connected with the reaction chamber 11 to detect a pressure in the reaction chamber 11 and output a first pressure signal PS1. The pressure controller 12b is electrically connected with the first pressure detector 12a. The pressure controller 12b generates a feedback signal FB according to the first pressure signal PS1 outputted from the first pressure detector 12a. For example, the pressure controller 12b calculates an adequate output value as the feedback signal FB by a control method of proportional-integral-derivative (PID) from the difference between the first pressure signal PS1 and a pressure setting value and sends the feedback signal FB to the mass flow controller 17. The separating device 13 is connected with the exhaust vent of the reaction chamber 11. The separating device 13 can remove the unreacted reaction gas and/or a byproduct after reaction from the exhaust gas EG. For example, the separating device 13 may be a filter to filter out the unreacted reaction gas and/or the byproduct from the exhaust gas EG. In one embodiment, the CVD apparatus of the present invention further comprises a throttle valve 14 arranged at a downstream side of the separating device 13, so that it can be avoided that the throttle valve 14 is contaminated by the unreacted reaction gas or a byproduct within the unfiltered exhaust gases. It can be understood that the CVD apparatus of the present invention comprises an exhaust pump 15 which is arranged at a downstream side of the throttle valve 14. The exhaust pump 15 is continuously pumping to make the processing gas PG and the exhaust gas EG flow along a fixed direction sequentially through the reaction chamber 11, the separating device 13, the throttle valve 14 and the exhaust pump 15, and then exhaust.

Generally, the throttle valve 14 is always in motion during process to control the pressure in the reaction chamber in conventional art. In the embodiment shown in FIG. 1, the open level of throttle valve 14 should be fixed during process. The open level of the throttle valve 14 is determined so as to make a target pressure in the reaction chamber 11 during pumping-down process which is usually done before film deposition process, and the open level of the throttle valve 14 is maintained during film deposition process. However, the open level of the throttle valve 14 may be adjusted again if sharp changing of the pressure in the reaction chamber 11 or the flow rate of the processing gas PG is necessary during film deposition process. Flow rate of ballast gas BG should be fixed to mean value of controllable range of the mass flow controller 17 during the adjusting process of open level of the throttle valve 14 because it gives a good controllability in both too high and too low pressure for setting value of the pressure in the reaction chamber 11. If there is no change in the pressure of the reaction chamber 11 or the flow rate of the processing gas PG during deposition process or there is no big difference in process condition depending on running, throttle valve 14 may be replaced by manual valve for low cost. If conductance of whole exhaust line is appropriate for process condition and pumping power, the throttle valve 14 can be omitted.

The ballast gas source 16 is connected between the exhaust vent of the reaction chamber 11 and the separating device 13, i.e. the downstream side of the reaction chamber 11 and the upstream side of the separating device 13. The mass flow controller 17 is electrically connected with the pressure controller 12b to receive the feedback signal FB output from the pressure controller 12b. The mass flow controller 17 can control a flow rate of a ballast gas BG from the ballast gas source 16 according to the feedback signal FB to adjust the pressure in the reaction chamber 11. The detail description of the control method will be provided later.

Figure 2:
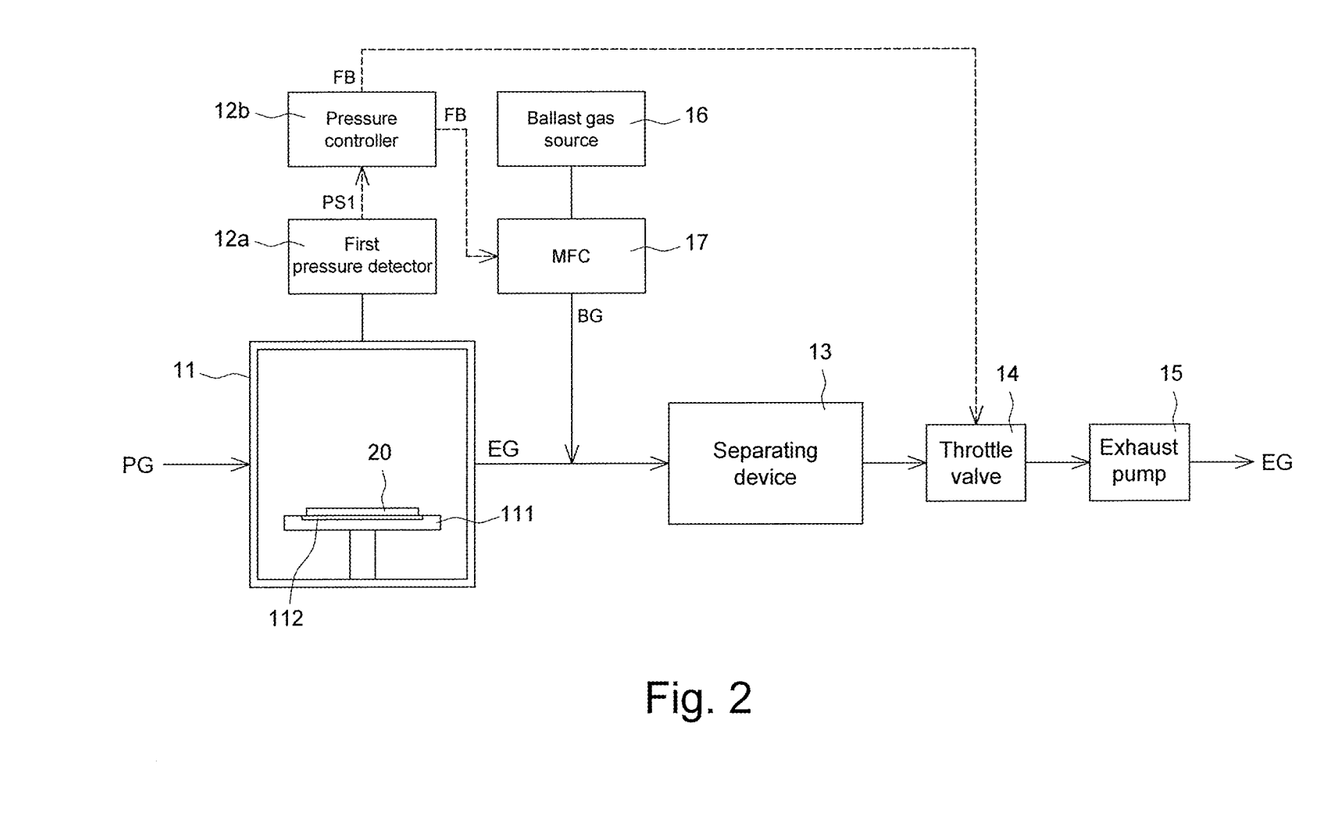
FIG. 2 is a diagram schematically illustrating a chemical vapor deposition apparatus according to a second embodiment of the present invention.

Referring to FIG. 2, in one embodiment, the throttle valve 14 is also electrically connected with the pressure controller 12b, and according to the feedback signal FB output from the pressure controller 12b, the open level of the throttle valve 14 can be adjusted to adjust the pressure in the reaction chamber 11. For example, suppose the flow rate of the processing gas PG flowing into the reaction chamber 11 is fixed and the pressure in the reaction chamber 11 is stable. Increasing the open level of the throttle valve 14 will increase the flow rate of the exhaust gas EG, which results the pressure in the reaction chamber 11 decreases. On the contrary, decreasing the open level of the throttle valve 14 will decrease the flow rate of the exhaust gas EG, which results the pressure in the reaction chamber 11 increases by the accumulated processing gas PG.

Figure 4A:
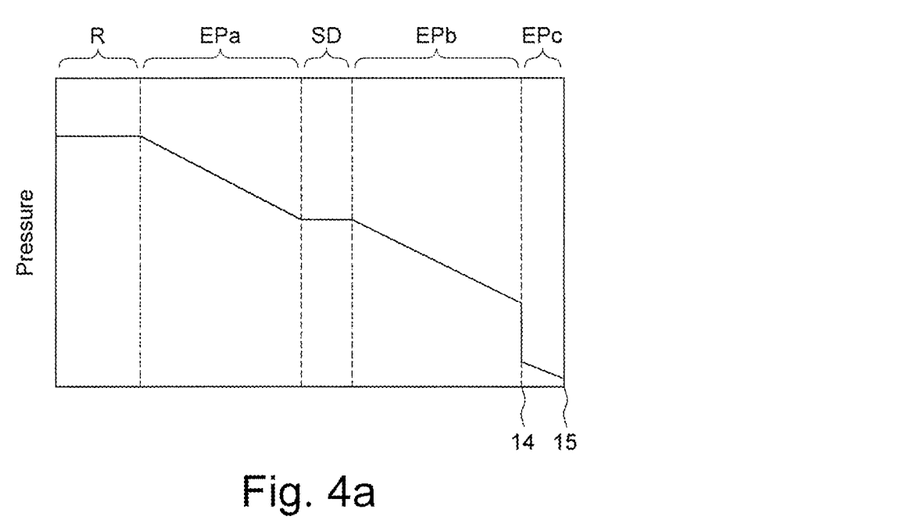
FIG. 4a is a diagram schematically illustrating a pressure distribution in an exhaust path of a chemical vapor deposition apparatus according to a prior art at a steady state.
Figure 4B:
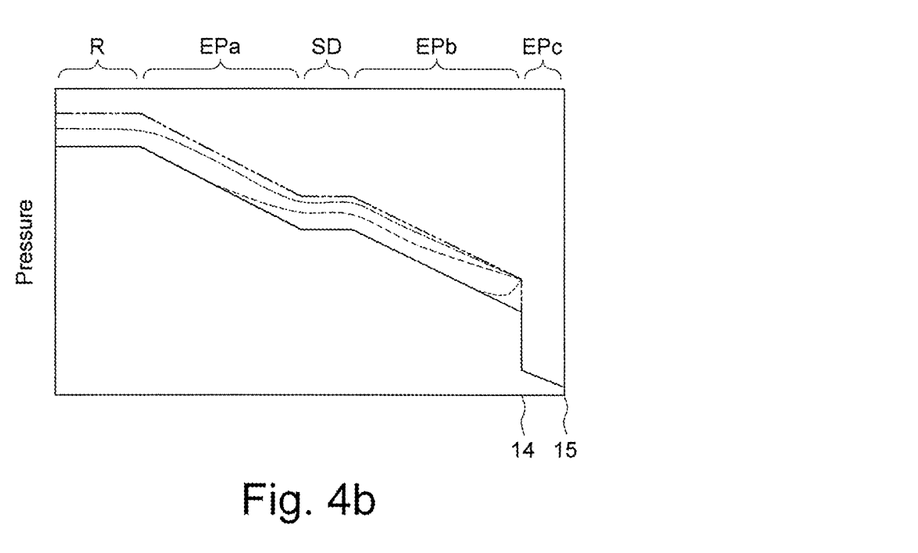
FIG. 4b is a diagram schematically illustrating a pressure distribution in an exhaust path of a chemical vapor deposition apparatus according to a prior art after decreasing open level of a throttle valve.

To make the control method of present invention more clear, at first a conventional pressure control method is explained. Referring to FIG. 1 and FIGS. 4a-4b, FIG. 4a shows a pressure distribution in an exhaust path of a chemical vapor deposition apparatus according to a prior art at a steady state, wherein the exhaust path is divided into a plurality of portions including the reaction chamber R, the exhaust pipe EPa between the reaction chamber 11 and the separating device 13, the separating device SD, the exhaust pipe EPb between the separating device 13 and the throttle valve 14 and the exhaust pipe EPc between the throttle valve 14 and the exhaust pump 15. As foregoing description, the flow rate of the processing gas PG flowing into the reaction chamber 11 is fixed and the pressure in the reaction chamber 11 is stable. In order to increasing the pressure in the reaction chamber 11, the flow rate of the exhaust gas EG from the reaction chamber 11 can be decrease, i.e. decreasing the open level of the throttle valve 14, so that the processing gas PG flowing into the reaction chamber 11 can be accumulated. It can be understood that the pressure in the separating device 13 must be increased in advance, and then the processing gas PG will gradually accumulate in the reaction chamber 11. As shown in FIG. 4b, the pressure close to the throttle valve 14 increases at first, as the short dash line shown in FIG. 4b. And then the pressure in the separating device 13 increases, as the long dash line shown in FIG. 4b. Finally, the pressure in the reaction chamber 11 gradually increases, as the one-dot chain line and the two-dot chain line shown in FIG. 4b. However, the separating device 13 has a larger space so that the time for rising pressure is longer, which results the pressure response in the reaction chamber 11 will delay, i.e. the pressure response in the reaction chamber 11 is slower. Thus the separating device 13 with large space has a disadvantage for the control response of the pressure in the reaction chamber 11.

Figure 5A:
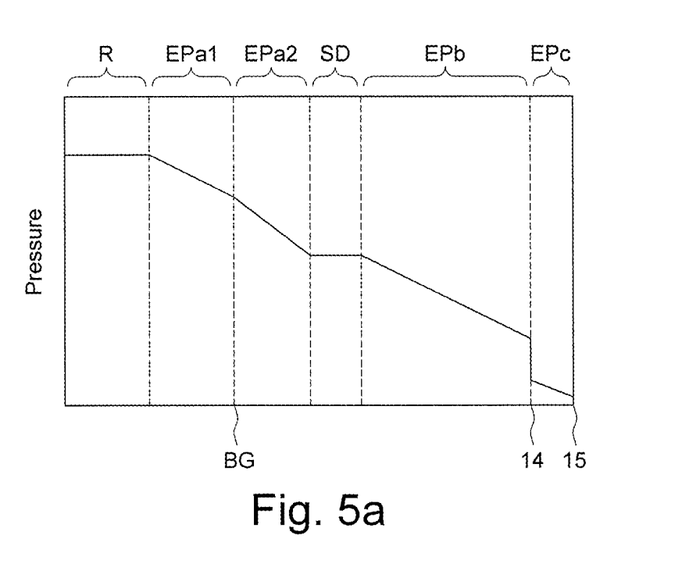
FIG. 5a is a diagram schematically illustrating a pressure distribution in an exhaust path of a chemical vapor deposition apparatus according to the first embodiment of the present invention at a steady state.
Figure 5B:
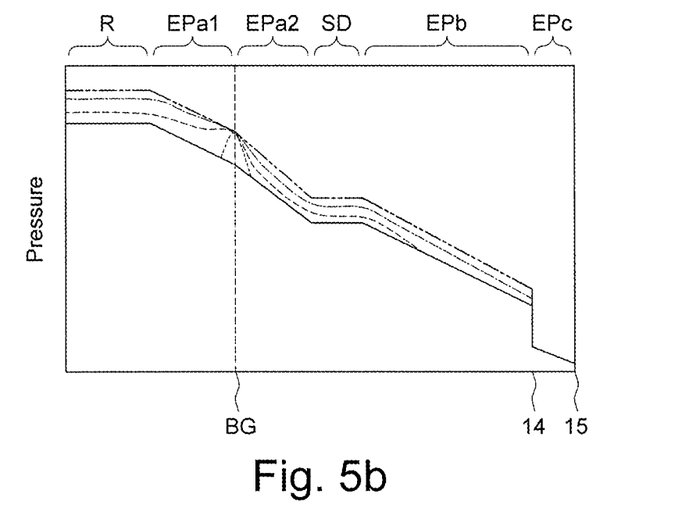
FIG. 5b is a diagram schematically illustrating a pressure distribution in an exhaust path of a chemical vapor deposition apparatus according to the first embodiment of the present invention after increasing flow rate of ballast gas.

Referring to FIG. 1 and FIGS. 5a-5b, FIG. 5a shows a pressure distribution in the exhaust path of a chemical vapor deposition apparatus according to the embodiment shown in FIG. 1 at a steady state, wherein the exhaust pipe between the reaction chamber 11 and the separating device 13 is divided into the exhaust pipe EPa1 between the reaction chamber 11 and the node connected with the ballast gas BG and the exhaust pipe EPa2 between the node and the separating device 13. The control method of the present invention is explained in the followings. It's supposed that the pressure in the reaction chamber 11 is kept the target value with a steady flow of the ballast gas BG. Now the pressure in the reaction chamber 11 becomes smaller than the target value by some reasons. At the moment, if the flow rate of the ballast gas BG is increased, then the local pressure at the node connected with the ballast gas BG becomes higher, as the short dash line shown in FIG. 5b. The effect of higher local pressure at the node will be immediately transferred to the reaction chamber 11, as the long dash line shown in FIG. 5b, because the node is so closer to the reaction chamber 11 and without big space there. As the result, too low pressure in the reaction chamber 11 is corrected into the target value immediately.

Figure 6:
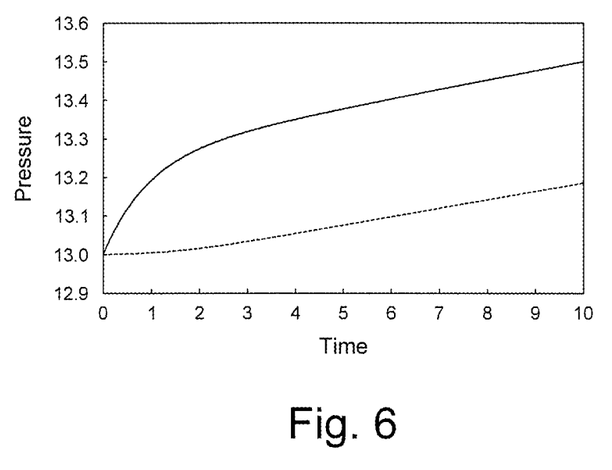
FIG. 6 is a simulation diagram schematically illustrating a pressure transition in a reaction chamber of a chemical vapor deposition apparatus according to a prior art and an embodiment of the present invention after controlling pressure.

Here, the mass flow controller 17 increases the flow rate of the ballast gas BG to make the space of the separating device 13 fill with the ballast gas BG rapidly, so that the pressure in the separating device 13 will increase rapidly. In other words, the processing gas PG will accumulate in the reaction chamber 11 in shorter time to make the pressure in the reaction chamber 11 increase rapidly, as the one-dot chain line and the two-dot chain line shown in FIG. 5b. Accordingly, the pressure response of the present invention (as the solid line shown in FIG. 6) is faster than the conventional pressure control method (as the dash line shown in FIG. 6). When the pressure in the reaction chamber 11 reaches a predetermined value, the mass flow controller 17 may decrease or close the flow rate of the ballast gas BG. On the contrary, to decreasing the pressure in the reaction chamber 11, the mass flow controller 17 may decrease or close the flow rate of the ballast gas BG so that the pressure in the separating device 13 and the reaction chamber 11 will decrease with the same open level of the throttle valve 14.

It can be understood that the pressure at the node connected with the ballast gas BG should be less than the pressure in the reaction chamber 11 to avoid the ballast gas BG flow back to the reaction chamber 11. Referring to the FIG. 3, in one embodiment, the chemical vapor deposition apparatus of the present invention further comprises a second pressure detector 12c connected between the exhaust vent of the reaction chamber 11 and the separating device 13. Preferably, the second pressure detector 12c is connected with the node connected with the ballast gas BG. The second pressure detector 12c detects the pressure at the node and outputs a second pressure signal PS2 to the pressure controller 12b. And then the pressure controller 12b can decrease the flow rate of the ballast gas BG to decrease the pressure at the node when the pressure at the node is greater than the pressure in the reaction chamber 11. In one embodiment, the pressure controller 12b generates the corresponding feedback signal FB according to at least one of the first pressure signal PS1 and the second pressure signal PS2 to control the flow rate of the ballast gas BG and/or the open level of the throttle valve 14.

Figure 3:
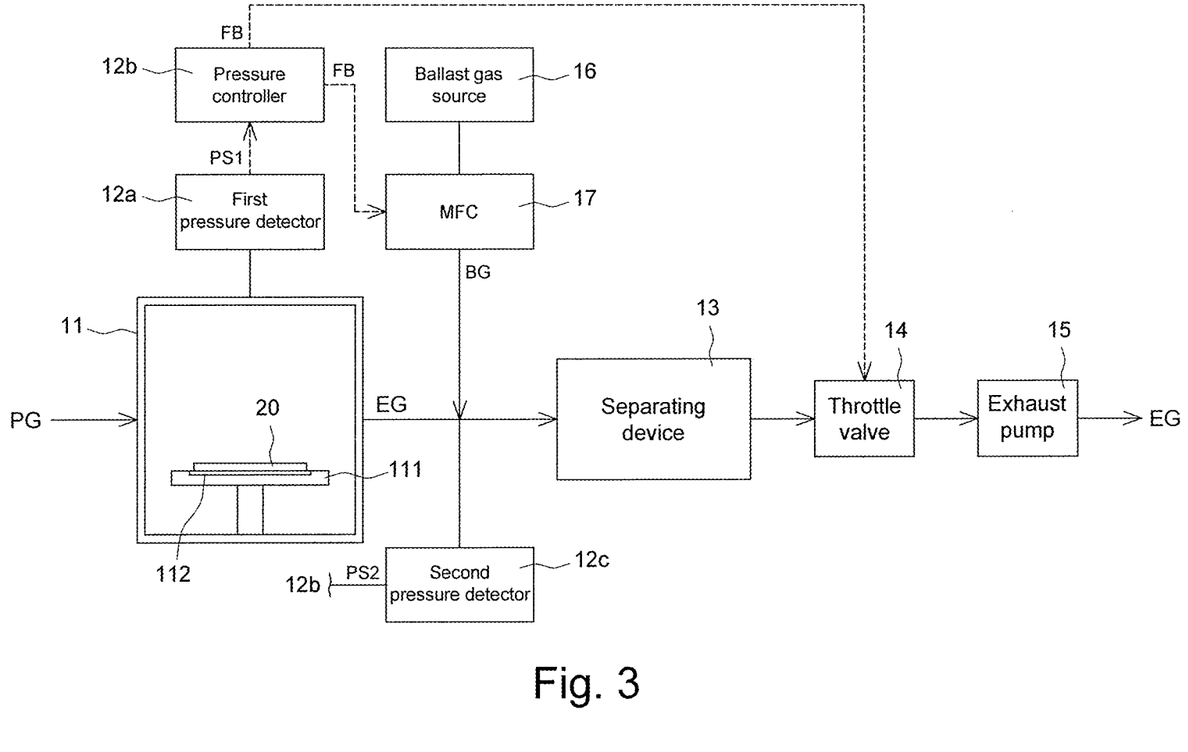
FIG. 3 is a diagram schematically illustrating a chemical vapor deposition apparatus according to a third embodiment of the present invention.

It should be noted that the pressure in the reaction chamber 11 can be adjusted roughly by the open level of throttle valve 14, and adjusted finely by the flow rate of ballast gas which also has a function to control pressure noise. Besides, the throttle valve 14 can be replaced by a manual valve which can adjust the conductance, or the exhaust pump 15 whose pumping power is adjustable can be used to roughly adjust the pressure in the reaction chamber 11 without any conductance valve. Extremely, if the conductance of whole exhaust system is match to the total flow rate of process gas to obtain the desirable reactor pressure, no conductance valve or special pump might be necessary.

In one embodiment, the separating device 13 may be an adsorption or reactive type filter, thus the unreacted reaction gas or the byproduct after reaction will be adsorbed on the filter material or react with the filter material. It can be understood that the reaction activity between the ballast gas BG and the separating device 13 is less than that between the reaction gas or the byproduct and the separating device 13 to avoid shortening life of the separating device 13 caused by consuming the filter material of the separating device 13 by the ballast gas BG. In one embodiment, the ballast gas BG and the carrier gas in the processing gas PG are the same. For example, the ballast gas may be hydrogen ($H_2$), nitrogen ($N_2$) or a combination thereof.

To summarize the foregoing descriptions, the chemical vapor deposition apparatus of the present invention provides a ballast gas source arranged at upstream side of a separating device and controls a flow rate of the ballast gas to change the local pressure at the node connected with the ballast gas. The effect of local pressure change by changing flow rate of the ballast gas is immediately transferred to the reaction chamber because the space between exhaust vent of the reaction chamber and the node connection with the ballast gas is smaller and the node is so closer to the reaction chamber, that leads to the faster pressure response in the reaction chamber and obtain a high quality films.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the scope of the appended claims.

What is claimed is:

1. A chemical vapor deposition apparatus, for forming a thin film on a substrate, comprising:
    a reaction chamber comprising an inlet port and an exhaust vent, wherein a processing gas flows into the reaction chamber through the inlet port, an exhaust gas is exhausted from the reaction chamber through the exhaust vent, and the processing gas comprises a reaction gas;
    a first pressure detector connected with the reaction chamber to detect a pressure in the reaction chamber and output a first pressure signal;
    a pressure controller electrically connected with the first pressure detector to generate a feedback signal according to the first pressure signal;
    a filter connected with the exhaust vent of the reaction chamber to remove unreacted reaction gas and a byproduct from the exhaust gas;
    a throttle valve disposed at a downstream side of the filter, and an open level of the throttle valve, wherein the open level of the throttle valve is adjustable to adjust the pressure of the chamber;
    a ballast gas source connected to a node between the exhaust vent of the reaction chamber and the filter to provide a ballast-gas flow from the ballast gas source;
    a second pressure detector deposed at the node between the exhaust vent of the reaction chamber and the filter to detect a pressure of the node and output a second pressure signal to the pressure controller; and
    a mass flow controller electrically connected with the pressure controller and used to control a ballast-gas flow rate of the ballast-gas flow, wherein the pressure controller control the mass flow controller to decrease the ballast-gas flow rate when the pressure of the node is greater than the pressure in the reaction chamber according to the first pressure signal and the second pressure signal.

2. The chemical vapor deposition apparatus according to claim 1, wherein the throttle valve is electrically connected with the pressure controller to control the open level of the throttle valve to adjust a flow rate of the throttle valve according to the feedback signal to keep pressure in the reaction chamber stable.

3. The chemical vapor deposition apparatus according to claim 1, wherein a reaction activity between the ballast gas and the filter is less than that between the reaction gas or the byproduct and the filter.

4. The chemical vapor deposition apparatus according to claim 1, wherein the processing gas comprises a carrier gas, and the ballast gas and the carrier gas are the same.

5. The chemical vapor deposition apparatus according to claim 1, wherein the ballast gas comprises hydrogen, nitrogen or a combination thereof.

6. The chemical vapor deposition apparatus according to claim 1, wherein the processing gas comprises an organic metal.

7. The chemical vapor deposition apparatus according to claim 1, wherein the thin film is a compound of semiconductor and oxidation film.

8. The chemical vapor deposition apparatus according to claim 1, further comprising an exhaust pump arranged at a downstream side of the throttle valve, and a pumping power of the exhaust pump is adjustable to adjust the pressure in the reaction chamber separating device.

9. The chemical vapor deposition apparatus according to claim 1, further comprising a holding element arranged in the reaction chamber to hold a substrate.

10. The chemical vapor deposition apparatus according to claim 1, further comprising a heating element arranged in the reaction chamber to heat the substrate.

11. The chemical vapor deposition apparatus according to claim 1, wherein the filter is an adsorption type filter to adsorb an unreacted gas or the byproduct.

12. The chemical vapor deposition apparatus according to claim 1, wherein the filter is a reactive type filter to react with an unreacted gas or the byproduct.

* * * * *